United States Patent
Tseng et al.

(10) Patent No.: US 11,239,086 B2
(45) Date of Patent: Feb. 1, 2022

(54) BACK END MEMORY INTEGRATION PROCESS

(71) Applicant: Applied Materials, Inc., Santa Clara, CA (US)

(72) Inventors: Hsin-wei Tseng, San Jose, CA (US); Mahendra Pakala, Santa Clara, CA (US); Lin Xue, San Jose, CA (US); Jaesoo Ahn, San Jose, CA (US); Sajjad Amin Hassan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/396,226

(22) Filed: Apr. 26, 2019

(65) Prior Publication Data

US 2019/0348294 A1   Nov. 14, 2019

Related U.S. Application Data

(60) Provisional application No. 62/671,357, filed on May 14, 2018.

(51) Int. Cl.
| | |
|---|---|
| *H01L 21/306* | (2006.01) |
| *H01L 23/544* | (2006.01) |
| *H01L 21/822* | (2006.01) |
| *G03F 9/00* | (2006.01) |

(52) U.S. Cl.
CPC ...... *H01L 21/30608* (2013.01); *G03F 9/7076* (2013.01); *G03F 9/7084* (2013.01); *H01L 21/8221* (2013.01); *H01L 23/544* (2013.01)

(58) Field of Classification Search
CPC ......... G03F 9/7073–7084; H01L 2223/54426; H01L 23/544; H01L 2223/54453–5448
See application file for complete search history.

(56) References Cited

U.S. PATENT DOCUMENTS

| | | | |
|---|---|---|---|
| 5,935,764 A * | 8/1999 | Kakehashi | G03F 7/70633 430/314 |
| 6,803,668 B2 | 10/2004 | Holloway et al. | |
| 8,642,416 B2 | 2/2014 | Or-Bach et al. | |
| 8,674,524 B1 | 3/2014 | Woerz et al. | |
| 10,199,330 B2 | 2/2019 | Woerz et al. | |

(Continued)

FOREIGN PATENT DOCUMENTS

WO    2005/114095 A2    12/2005

*Primary Examiner* — John A Bodnar
(74) *Attorney, Agent, or Firm* — Patterson + Sheridan, LLP

(57) ABSTRACT

Embodiments described herein relate to substrate processing methods. More specifically, embodiments of the disclosure provide for an MRAM back end of the line integration process which utilizes a zero mark for improved patterning alignment. In one embodiment, the method includes fabricating a substrate having at least a bottom contact and a via extending from the bottom contact in a first region and etching a zero mark in the substrate in a second region apart from the first region. The method also includes depositing a touch layer over the substrate in the first region and the second region, depositing a memory stack over the touch layer in the first region and the second region, and depositing a hardmask over the memory stack layer in the first region and the second region.

18 Claims, 7 Drawing Sheets

(56) References Cited

U.S. PATENT DOCUMENTS

| | | | |
|---|---|---|---|
| 2002/0031901 A1* | 3/2002 | Sadjadi | H01L 21/76804 |
| | | | 438/597 |
| 2005/0068508 A1 | 3/2005 | Mattiza et al. | |
| 2014/0027864 A1* | 1/2014 | Zhu | H01L 29/6659 |
| | | | 257/410 |
| 2016/0093670 A1* | 3/2016 | Jiang | H01L 43/12 |
| | | | 257/421 |
| 2016/0268336 A1* | 9/2016 | Shum | H01L 43/12 |

* cited by examiner

BACK END MEMORY INTEGRATION PROCESS

CROSS-REFERENCE TO RELATED APPLICATIONS

This application claims benefit to U.S. Provisional Patent Application No. 62/671,357, filed May 14, 2018, the entirety of which is herein incorporated by reference.

BACKGROUND

Field

Embodiments of the present disclosure generally relate to substrate processing methods. More specifically, embodiments of the disclosure relate to a back end of the line memory integration processes.

Description of the Related Art

Magnetoresistive random access memory (MRAM) is a common type of magnetic memory which is utilized in many data storage applications. One example of MRAM is spin torque transfer (STT) MRAM which utilizes a magnetic tunnel junction. STT-MRAM is commonly implemented for data storage applications and has several advantages; low power, low cost of flash memory, and scaling below 10 nm. Since STT-MRAM is non-volatile, STT-MRAM retains data indefinitely when the power is lost or completely turned off.

However, at advanced nodes, such as below 10 nm, suitable pad smoothness is difficult to achieve. A pad, which is a film disposed between a conductive via and the memory stack, with undesirable roughness can lead to defectivity of the device. Moreover, lithographic scanning processes are difficult to align due to the reflectivity of metals used in the memory stack. Misalignment during patterning can also lead to device defectivity.

Thus, what is needed in the art are improved methods for substrate processing.

SUMMARY

In one embodiment, a substrate processing method is provided. The method includes fabricating a substrate having at least a bottom contact and a via extending from the bottom contact in a first region and etching a zero mark in the substrate in a second region apart from the first region. A touch layer is deposited over the substrate in the first region and the second region, a memory stack is deposited over the touch layer in the first region and the second region, and a hardmask is deposited over the memory stack in the first region and the second region.

In another embodiment, a substrate processing method is provided. The method includes forming a bottom contact on a substrate, forming a metallic via extending from the bottom contact in a first region, and etching a zero mark in the substrate in a second region apart from the first region. A touch layer is conformally deposited over the substrate in the first region and the second region, a memory stack is conformally deposited over the touch layer in the first region and the second region, and a hardmask is conformally deposited over the memory stack in the first region and the second region. At least the first region is patterned and the hardmask, memory stack, and the touch layer are etched.

In yet another embodiment, a substrate processing method is provided. The method includes forming a bottom contact on a substrate, depositing an interlayer dielectric material on the substrate, etching the interlayer dielectric material to expose the bottom contact, forming a metallic via extending from the bottom contact in a first region, and etching a zero mark in the interlayer dielectric material in a second region apart from the first region. A touch layer is conformally deposited over the interlayer dielectric material and the metallic via in the first region and the second region, a memory stack is conformally deposited over the touch layer in the first region and the second region, and a hardmask is conformally deposited over the memory stack in the first region and the second region. At least the first region is patterned, the hardmask, the memory stack, and the touch layer are etched to expose the interlayer dielectric material, and an additional interlayer dielectric material is deposited and planarized with the hardmask. At least a portion of the hardmask is etched to form a recess and a top contact is deposited over the additional interlayer dielectric material and in the recess.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to substrate processing methods. More specifically, embodiments of the disclosure provide for an MRAM/memory back end of the line integration process flow which utilizes a zero mark for improved patterning alignment. Processes described herein are contemplated to enable MRAM/memory back end of the line integration processes for advanced complimentary metal oxide semiconductor (CMOS) nodes, such as sub-10 nm or beyond. In one embodiment, the method includes fabricating a substrate having at least a bottom contact and a via extending from the bottom contact in a first region and etching a zero mark in the substrate in a second region apart from the first region. The method also includes depositing a touch layer over the substrate in the first region and the second region, depositing a memory stack over the touch layer in the first region and the second region, and depositing a hardmask over the memory stack layer in the first region and the second region.

Figure 1:
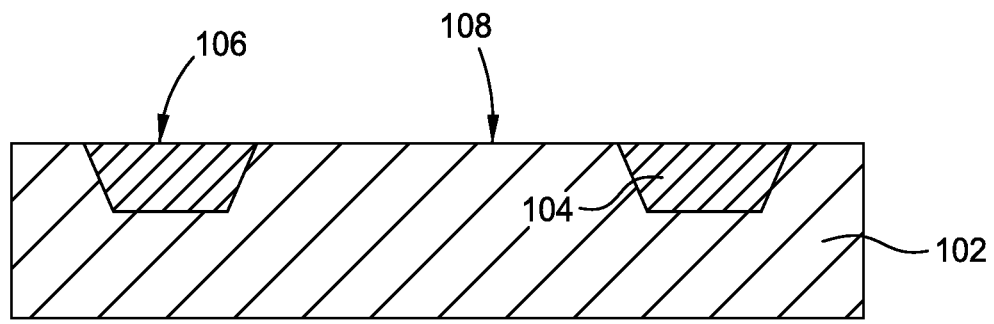
FIG. 1 illustrates a schematic cross-sectional view of a substrate with a bottom contact formed thereon according to an embodiment described herein.

FIG. 1 illustrates a schematic cross-sectional view of a substrate 102 with a bottom contact 104 formed thereon according to an embodiment described herein. The substrate 102 is patterned and etched and the bottom contact 104 is formed on the substrate 102. Although the bottom contact is illustrated as having a trapezoidal cross-sectional shape, it is contemplated that various other shapes and orientations may be advantageously utilized in accordance with the embodiments described herein.

A top surface 108 of the substrate 102 is substantially planar. Similarly, a top surface 106 of the bottom contact 104 is substantially planar. In one embodiment, the top surface 108 and the top surface 106 are substantially co-planar. Planarization processes utilized to planarize one or both of the top surface 108 and the top surface 106 include chemical mechanical polishing (CMP) processes, wet etching processes, dry etching processes, or other suitable planarization processes. Examples of apparatus suitable to planarize the top surfaces 106, 108 include the PRIME® series of CMP apparatus available from Applied Materials, Inc., Santa Clara, Calif. It is contemplated that other similarly configured apparatus from other manufacturers may also be utilized in accordance with the embodiments described herein.

In one embodiment, the bottom contact 104 is fabricated from an electrically conductive material, such as a metal containing material. Depending upon the desired implementation, the bottom contact 104 is deposited on the substrate by a chemical vapor deposition (CVD) process, a physical vapor deposition (PVD) process, and epitaxial layer deposition process, an atomic layer deposition process, or the like. Examples of apparatus suitable to deposit the bottom contact 104 include the ENDURA® series of apparatus available from Applied Materials, Inc., Santa Clara, Calif. It is contemplated that other similarly configured apparatus from other manufacturers may also be utilized in accordance with the embodiments described herein.

In one embodiment, the substrate 102 is made of a conductive material. In this embodiment, the substrate 102 includes one or a combination of a metal material, such as a tantalum containing material, a tantalum nitride containing material, a titanium nitride containing material, a ruthenium containing material, alloys of tantalum, and alloys of ruthenium, among others. In operation, the metallic substrate 102 may function as a lead in certain embodiments. In another embodiment, the substrate 102 is made of an insulative material. In this embodiment, the substrate 102 includes a dielectric material, such as a silicon dioxide containing material, an aluminum oxide containing material, and mixtures and combinations thereof.

Figure 2:
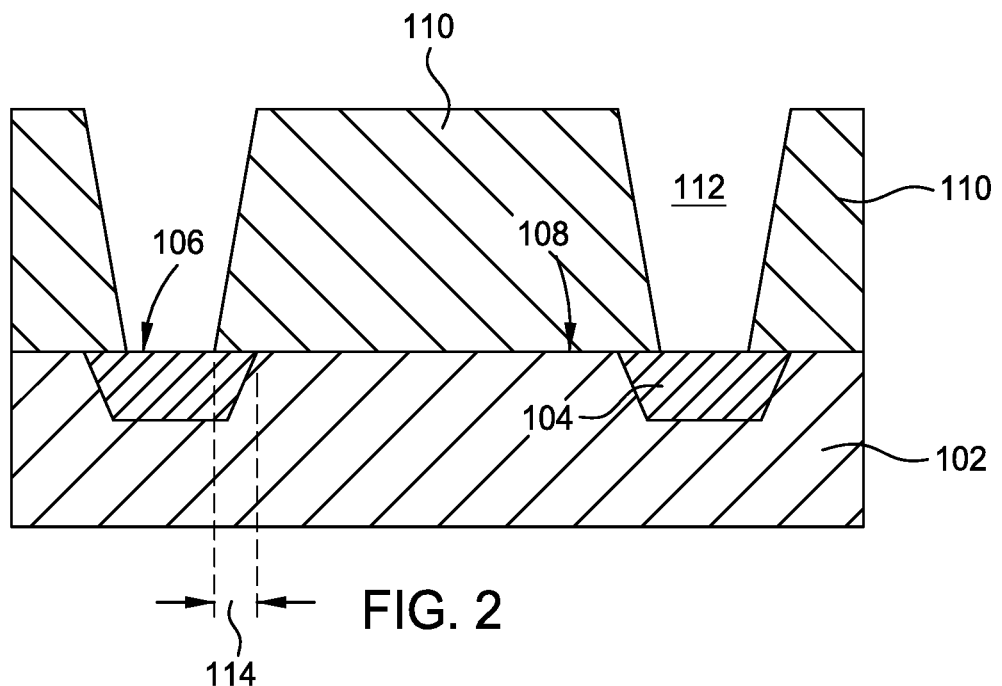
FIG. 2 illustrates a schematic cross-sectional view of the substrate of FIG. 1 with a patterned interlayer dielectric material formed thereon according to an embodiment described herein.

FIG. 2 illustrates a schematic cross-sectional view of the substrate 102 of FIG. 1 with a patterned interlayer dielectric material 110 formed thereon according to an embodiment described herein. The interlayer dielectric material 110 is formed over the substrate 102 and the bottom contact 104 and subsequently patterned. In one embodiment, the interlayer dielectric material is an oxide containing material, such as a silicon dioxide material or the like. In one embodiment, the oxide material is deposited by a flowable oxide deposition process. Examples of apparatus suitable to deposit the oxide material include the PRODUCER® series of apparatus available from Applied Materials, Inc., Santa Clara, Calif. It is contemplated that other similarly configured apparatus from other manufacturers may also be utilized in accordance with the embodiments described herein.

The patterned interlayer dielectric material 110 is subsequently etched to form a recess 112 which is substantially aligned above the bottom contact 104 such that the top surface 106 of the bottom contact 104 is exposed within the recess 112.

Etching of the interlayer dielectric material 110 is performed by an oxide etching process. In one embodiment, the etching process is a plasma etching process which may be an isotropic or anisotropic etching process depending upon various process conditions and etchants utilized. Examples of apparatus suitable to deposit the oxide material include the CENTURA® and PRODUCER® series of etching apparatus available from Applied Materials, Inc., Santa Clara, Calif. It is contemplated that other similarly configured apparatus from other manufacturers may also be utilized in accordance with the embodiments described herein.

The patterning and etching of the interlayer dielectric material 110 results in the recess 112 having a width at the top surface 106 of the bottom contact 104 which is less than a width of the top surface 106. As such, a portion 114 of the top surface 106 of the bottom contact 104 is covered by the interlayer dielectric material 110 and remains unexposed by the recess 112. It is contemplated that by fabricating the top surface 106 with a width greater than a width of the recess 112 at the top surface 106, alignment of the recess 112 with the bottom contact 104 is more easily achieved and improves contact of a subsequently deposited via with the bottom contact 104.

Figure 3:
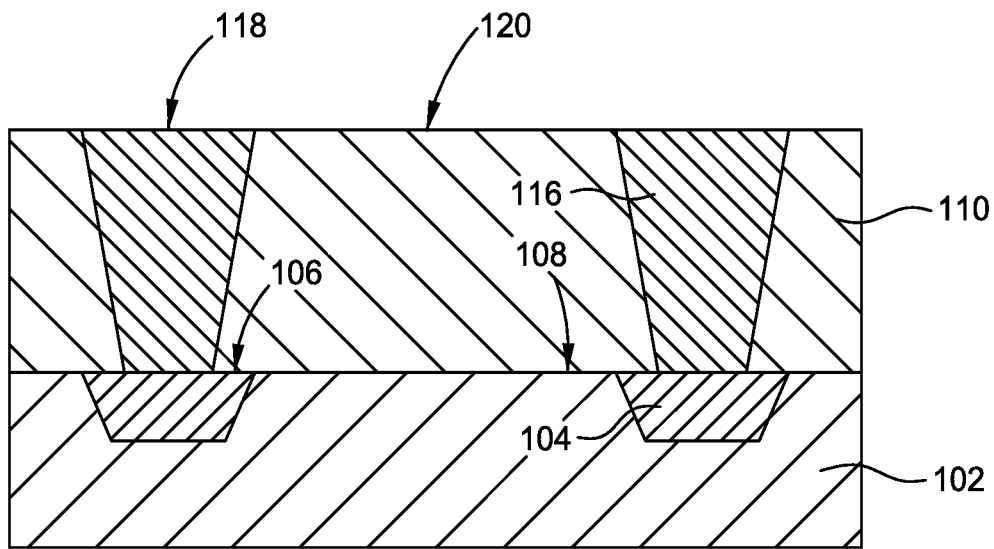
FIG. 3 illustrates a schematic cross-sectional view of the substrate of FIG. 2 with via structures formed thereon according to an embodiment described herein.

FIG. 3 illustrates a schematic cross-sectional view of the substrate 102 of FIG. 2 with a via structure 116 formed thereon according to an embodiment described herein. The via structure 116 is deposited in the recess 112. The completed via structure 116 substantially fills the recess 112. In one embodiment, the via structure 116 is deposited on and in contact with the top surface 106 of the bottom contact 104. The via structure 116 is formed from a conductive material, such as a metal containing material, for example, a copper containing material, a tungsten containing material, a titanium nitride containing material, a ruthenium material, and combinations thereof. As a result, the bottom contact 104 may be considered to be in electrical communication with the via structure 116 when an electron travels between the bottom contact 104 and the via structure 116.

Similar to the bottom contact 104, the via structure 116 may be deposited by a CVD process, a PVD process, an epitaxial layer deposition process, an atomic layer deposition process, or the like. As described above, the via structure 116 is fabricated such that the via structure 116 substantially fills the recess 112 formed in the interlayer dielectric material 110. After formation of the via structure 116, the interlayer dielectric material 110 and the via structure 116 are planarized. In one embodiment, a top surface 118 of the via structure 116 is substantially coplanar with a top surface 120 of the interlayer dielectric material 110.

Figure 4:
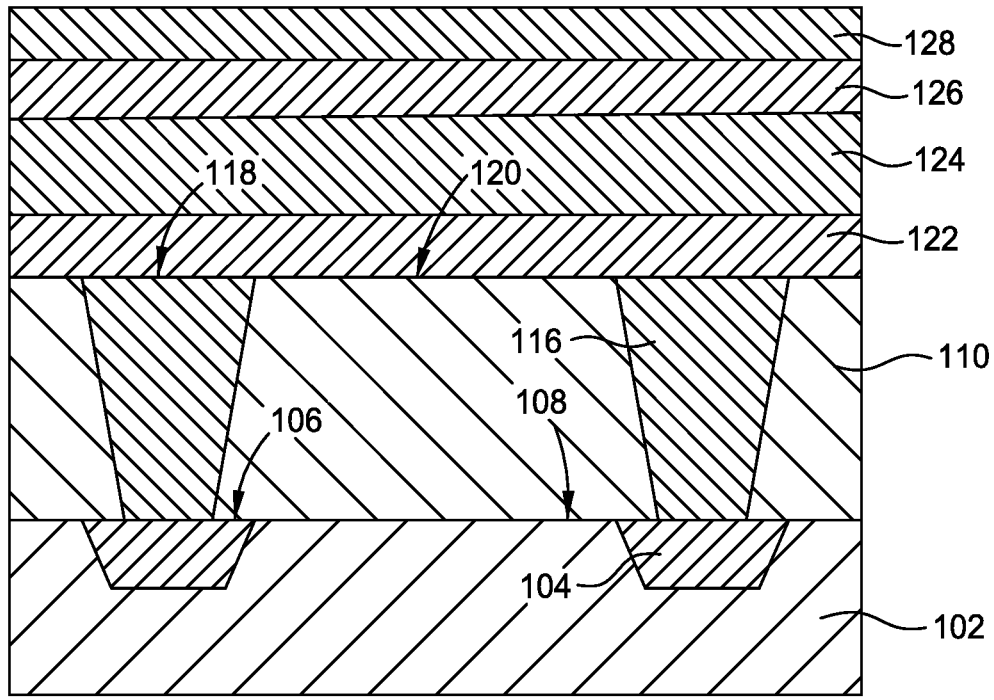
FIG. 4 illustrate a schematic cross-sectional view of the substrate of FIG. 3 with a plurality of layers formed thereon according to an embodiment described herein.

FIG. 4 illustrate a schematic cross-sectional view of the substrate 102 of FIG. 3 with a plurality of layers formed thereon according to an embodiment described herein. In one embodiment, a touch layer 122 is formed over the interlayer dielectric material 110 and the via structure 116. More specifically, the touch layer 122 is deposited on and in contact with the top surface 118 of the via structure 116 and the top surface 120 of the interlayer dielectric material 110.

The touch layer 122 is fabricated from a conductive material, such as a metal containing material, for example, a tantalum nitride containing material, a tantalum containing material, or a tungsten containing material. In one embodiment, the touch layer 122 is conformally deposited over the interlayer dielectric material 110 and the via structure 116 by an atomic layer deposition (ALD) process, a chemical vapor deposition (CVD) process, and/or a physical vapor deposition (PVD) process. The touch layer 122 is deposited to a thickness sufficient to generate a substantially planar and smooth surface when subjected to a CMP process. In one embodiment, the touch layer 122 is utilized in a pad-less integration process. In another embodiment, the touch layer 122, depending upon the thickness of the touch layer 122, may be considered a pad and utilized in a pad containing integration process. It is contemplated that utilizing the touch layer 122 enables generation of a smooth surface which facilitates improved deposition characteristics of subsequently deposited films. In addition, the touch layer 122 is believed to prevent or substantially reduce diffusion of metallic ions from the via structure 116 to enable improved device performance and to improve contact between the via structure 116 and a memory stack 124.

The memory stack 124 is formed over the touch layer 122. In one embodiment, the memory stack 124 is conformally deposited on and in contact with the touch layer 122. The memory stack 124 includes a plurality of films utilized to form a metallic tunnel junction. In various embodiments, the memory stack 124 includes, but is not limited to, a first cobalt/platinum containing film, a ruthenium containing film, a second cobalt/platinum containing film, a first cobalt/iron/boron containing film, a first magnesium oxide containing film, a second cobalt/iron/boron containing film, a second magnesium oxide containing film, and a tantalum containing film. In one embodiment, the memory stack 124 include a metallic electrode layer which is deposited as the topmost film in the memory stack 124. Apparatus suitable for formation of the memory stack 124 include the ENDURA® processing apparatus available from Applied Materials, Inc., Santa Clara, Calif. It is contemplated that other suitably configured apparatus from other manufacturers may also be utilized to fabricate the memory stack 124.

A first hardmask 126 is formed over the memory stack 124. In one embodiment, the first hardmask 126 is conformally deposited on and in contact with the memory stack 124. In one embodiment, the first hardmask is fabricated from a metal containing material. A second hardmask 128 is formed over the first hardmask 126. In one embodiment, the second hardmask 128 is conformally deposited on and in contact with the first hardmask 126. In one embodiment, the second hardmask 128 is fabricated from a non-metallic material, such as a carbon containing material or other material which is suitable for patterning and etching processes.

Figure 5:
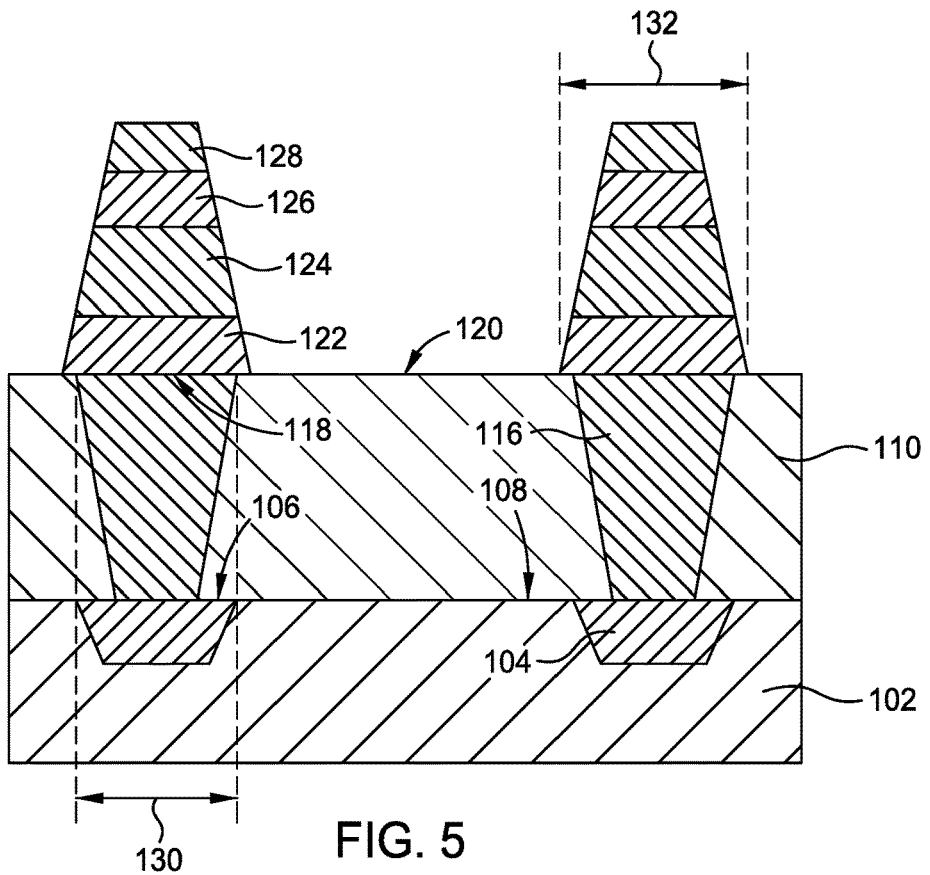
FIG. 5 illustrates a schematic cross-sectional view of the substrate of FIG. 4 after patterning of the plurality of layers according to an embodiment described herein.

FIG. 5 illustrates a schematic cross-sectional view of the substrate 102 of FIG. 4 after patterning of the plurality of layers 122, 124, 126, 128 according to an embodiment described herein. The plurality of layers 122, 124, 126, 128 are patterned and etched to selectively expose portions of the top surface 120 of the interlayer dielectric material 110. In one embodiment, etching of the touch layer 122 and the memory stack 124 is performed by the RAPTOR™ series of etch apparatus available from Applied Materials, Inc., Santa Clara, Calif. It is contemplated that other suitably configured apparatus from other manufacturers may be utilized in accordance with the embodiments described herein. In one embodiment, etching of the first hardmask 126 and the second hardmask 128 is performed by the CENTURA® series of etching apparatus available from Applied Materials, Inc., Santa Clara, Calif. It is contemplated that other similarly configured apparatus from other manufacturers may also be utilized in accordance with the embodiments described herein.

The plurality of layers 122, 124, 126, 128 are patterned and etched to align with the via structure 116. In one embodiment, a width 130 of the via structure 116 at the top surface 118 is less than a width 132 of the touch layer 122 at the top surface 118. In one embodiment, a difference in width between the width 130 and the width 132 is less than one third of the width 132. For example, if the width 312 is about 60 nm, the difference between the width 130 and the width 132 is less than about 20 nm. It is believed that the larger width 132 of the touch layer 122 enables improved alignment between the plurality of layers 122, 124, 126, 128 and the via structure 116.

Figure 6:
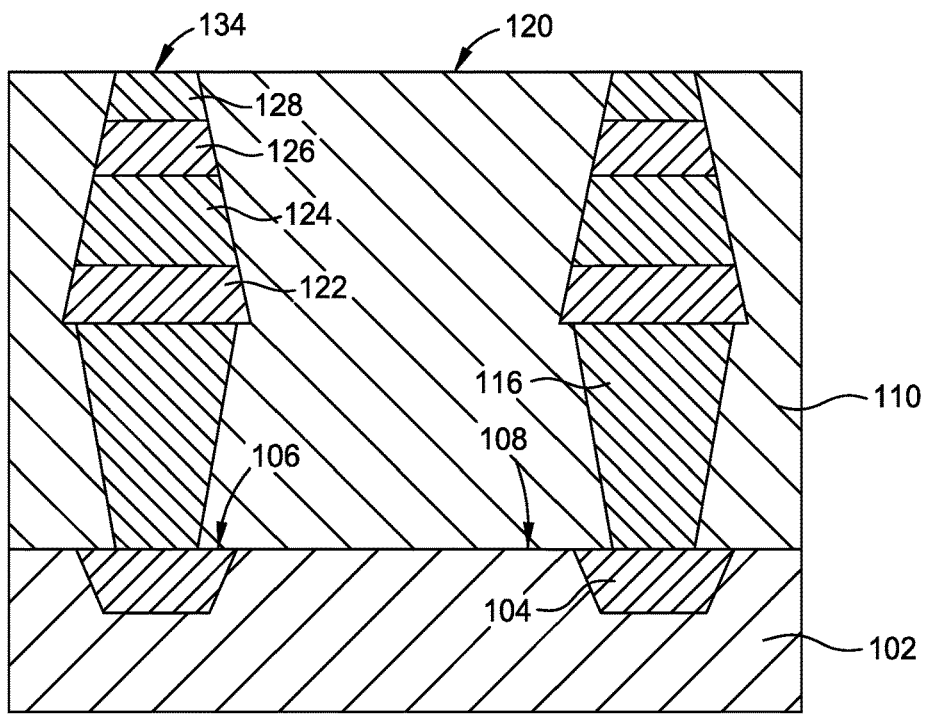
FIG. 6 illustrates a schematic cross-sectional view of the substrate of FIG. 5 after deposition of an additional interlayer dielectric material thereon according to an embodiment described herein.

FIG. 6 illustrates a schematic cross-sectional view of the substrate 102 of FIG. 5 after deposition of additional interlayer dielectric material thereon according to an embodiment described herein. Additional interlayer dielectric material 110 is deposited such that the top surface 120 of the interlayer dielectric material 110 is substantially coplanar with a top surface 134 of the second hardmask 128. The additional interlayer dielectric material is deposited by the same or similar process to the deposition of the interlayer dielectric material 110 described with regard to FIG. 2. In one embodiment, the top surface 134 and the top surface 120 are planarized, for example, by a CMP process to achieve co-planarity.

Figure 7:
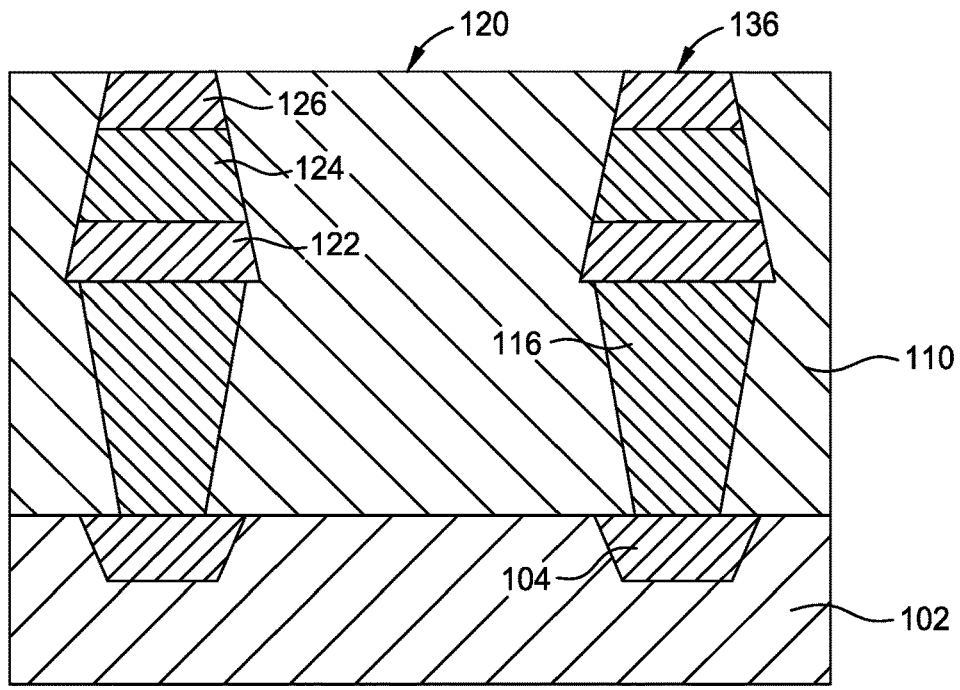
FIG. 7 illustrates a schematic cross-sectional view of the substrate of FIG. 6 after etching of a hardmask and planarization of the additional interlayer dielectric material according to an embodiment described herein.

FIG. 7 illustrates a schematic cross-sectional view of the substrate 102 of FIG. 6 after etching of the first and second hardmask 126, 128 and planarization of the interlayer dielectric material 110 according to an embodiment described herein. In one embodiment, the second hardmask 128 is removed by a plasma based etching process. A portion of the first hardmask 126 may also be removed by the plasma based etching process. In this embodiment, etching of the first hardmask 126 and the second hardmask 128 is performed by the CENTURA® series of etching apparatus available from Applied Materials, Inc., Santa Clara, Calif. It is contemplated that other similarly configured apparatus from other manufacturers may also be utilized in accordance with the embodiments described herein. Optionally, after etching of one or both of the first hardmask 126 and the second hardmask 128, the interlayer dielectric material 110 is planarized such that the top surface 120 of the interlayer dielectric material 110 is substantially coplanar with a top surface 136 of the first hardmask 126.

Figure 8:
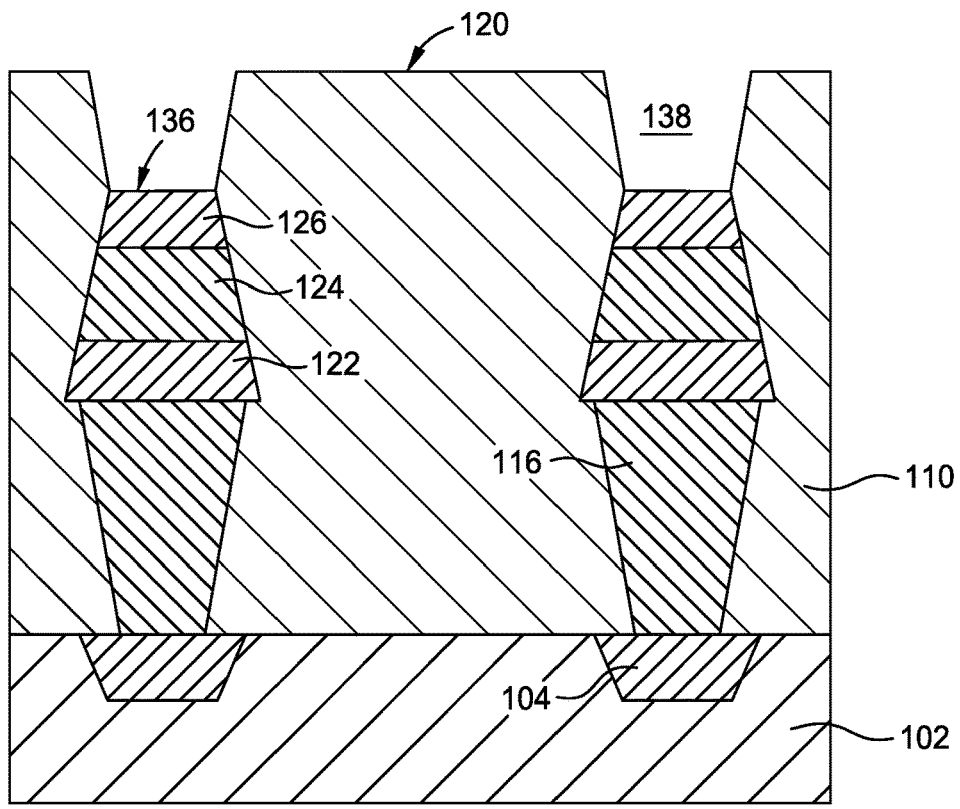
FIG. 8 illustrates a schematic cross-sectional view of the substrate of FIG. 7 after patterning of the additional interlayer dielectric material according to an embodiment described herein.

FIG. 8 illustrates a schematic cross-sectional view of the substrate of FIG. 7 after patterning of additional interlayer dielectric material according to an embodiment described herein. Additional interlayer dielectric material 110 is deposited to elevate a top surface 120 of the interlayer dielectric material 110 above the top surface 136 of the first hardmask 126. In one embodiment, the deposition of an oxide is performed by a blanket deposition process, such as a flowable oxide process. In this embodiment, the interlayer dielectric material 110 is deposited over the top surface 136 of the first hardmask 126. Similar to previous fabrication of the interlayer dielectric material 110, apparatus utilized to deposit the oxide material includes the PRODUCER® series of deposition apparatus available from Applied Materials, Inc., Santa Clara, Calif. It is contemplated that other similarly configured apparatus from other manufacturers may also be utilized in accordance with the embodiments described herein.

The interlayer dielectric material 110 is patterned and etched to form a recess 138 which exposes the top surface 136 of the first hardmask 126 therein. In this embodiment, the top surface 120 of the interlayer dielectric material 110 is above the top surface 136 of the first hardmask 126. Etching of the interlayer dielectric material 110 to form the recess 138 is similar to the etching process described with regard to FIG. 2 and may utilize similar apparatus. After patterning and etching the interlayer dielectric material 110, a planarization process may be performed, if desired, to planarize the top surface 120 of the interlayer dielectric material 110.

Figure 9:
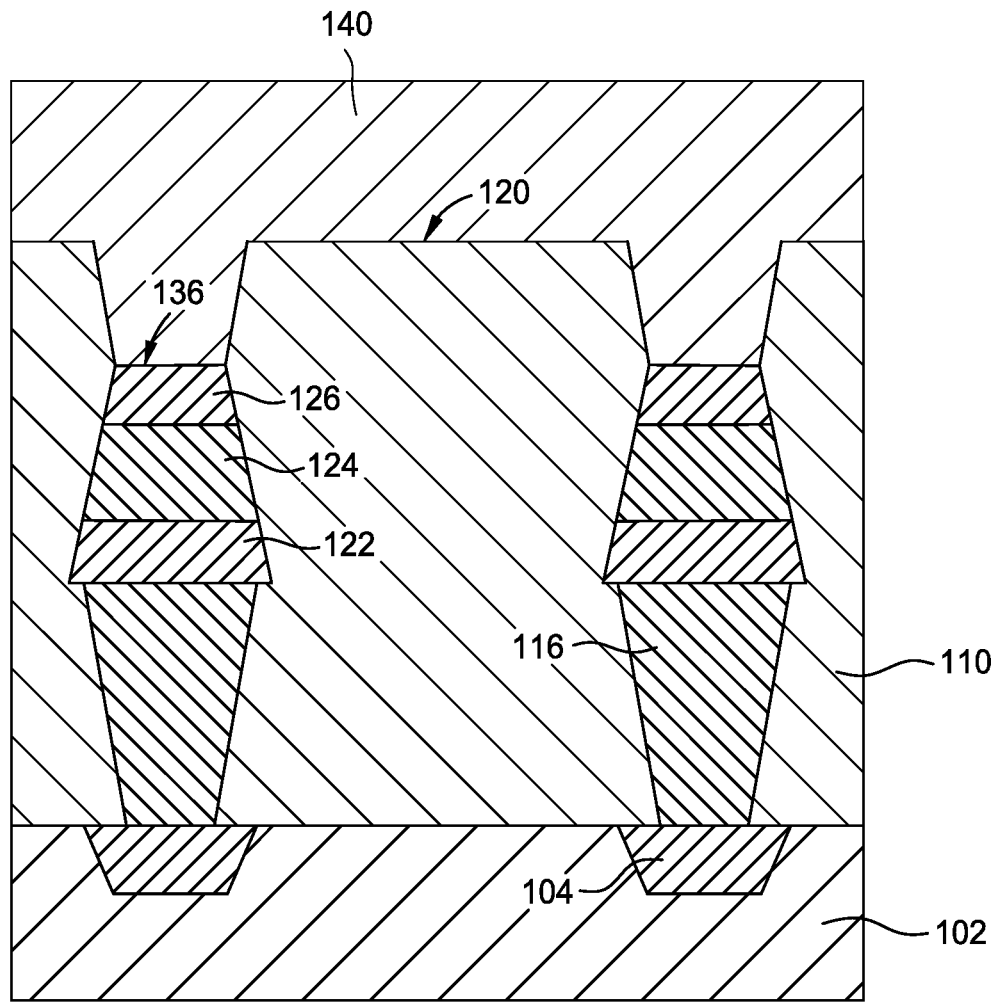
FIG. 9 illustrates a schematic cross-sectional view of the substrate of FIG. 8 after formation of a top contact thereon according to an embodiment described herein.

FIG. 9 illustrates a schematic cross-sectional view of the substrate 102 of FIG. 8 after formation of a top contact 140 thereon according to an embodiment described herein. The top contact 140 is deposited over the interlayer dielectric material 110 and in the recess 138. As such, the top contact 140 is deposited on and in contact with the first hardmask 126. In one embodiment, the top contact 140 is fabricated from a conductive metal containing material. For example, the top contact 140 is formed from the same material utilized to form the via structure 116. Alternatively, the top contact 140 and the via structure 116 may be fabricated from different conductive materials.

Figure 10:
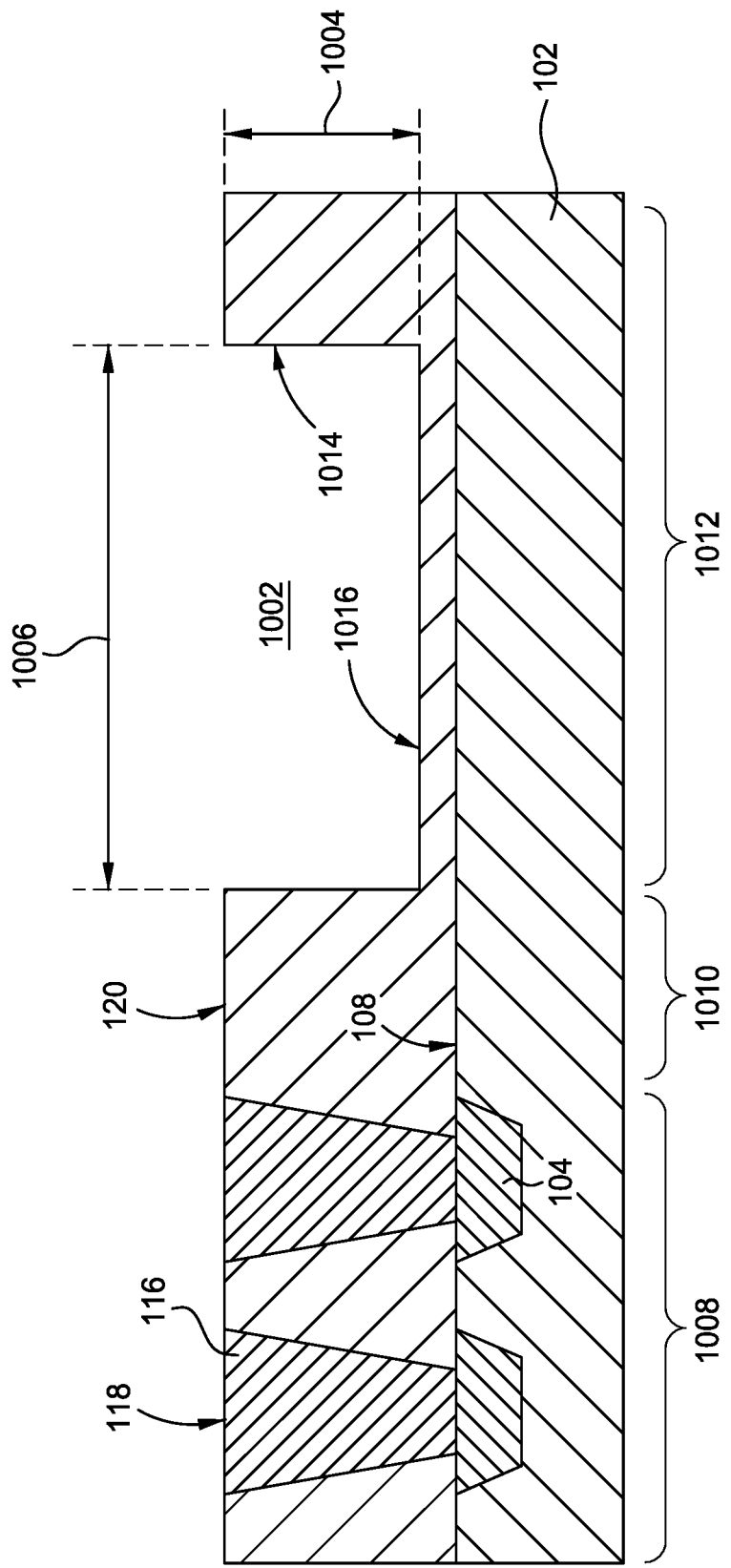
FIG. 10 illustrates a schematic cross-sectional view of the substrate of FIG. 3 with a zero mark formed thereon according to an embodiment described herein.

FIG. 10 illustrates a schematic cross-sectional view of the substrate 102 of FIG. 3 with a zero mark 1002 formed thereon according to an embodiment described herein. The substrate 102 includes a first region 1008, a second region 1012, and a third region 1010 disposed between the first region 1008 and the second region 1012. In one embodiment, the first region 1008 includes a memory array, the second region 1012 includes the zero mark 1002, and the third region 1010 includes logic structures.

The zero mark 1002 is fabricated prior to deposition of the plurality of layers 122, 124, 126, 128 and is etched by an anisotropic oxide etching process. The anisotropic etching process is utilized to form substantially vertical sidewalls 1014. The zero mark 1002 is formed in the interlayer dielectric material 110 and the zero mark 1002 is a recess extending from the top surface 120 of the interlayer dielectric material 110. The zero mark 1002 extends a depth 1004 which is less than a total thickness of the interlayer dielectric material 110. For example, after etching of the zero mark 1002, oxide material remains between a bottom surface 1016 of the zero mark 1002 and the top surface 108 of the substrate 102.

A width 1006 of the zero mark 1002 is contemplated to be large enough to remain visible to a lithographic scanner after deposition of the plurality of layers 122, 124, 126, 128 therein. In one embodiment, the zero mark 1002 has a width 1006 of greater than about 0.5 µm, such as between about 1 µm and about 2 µm.

Figure 11:
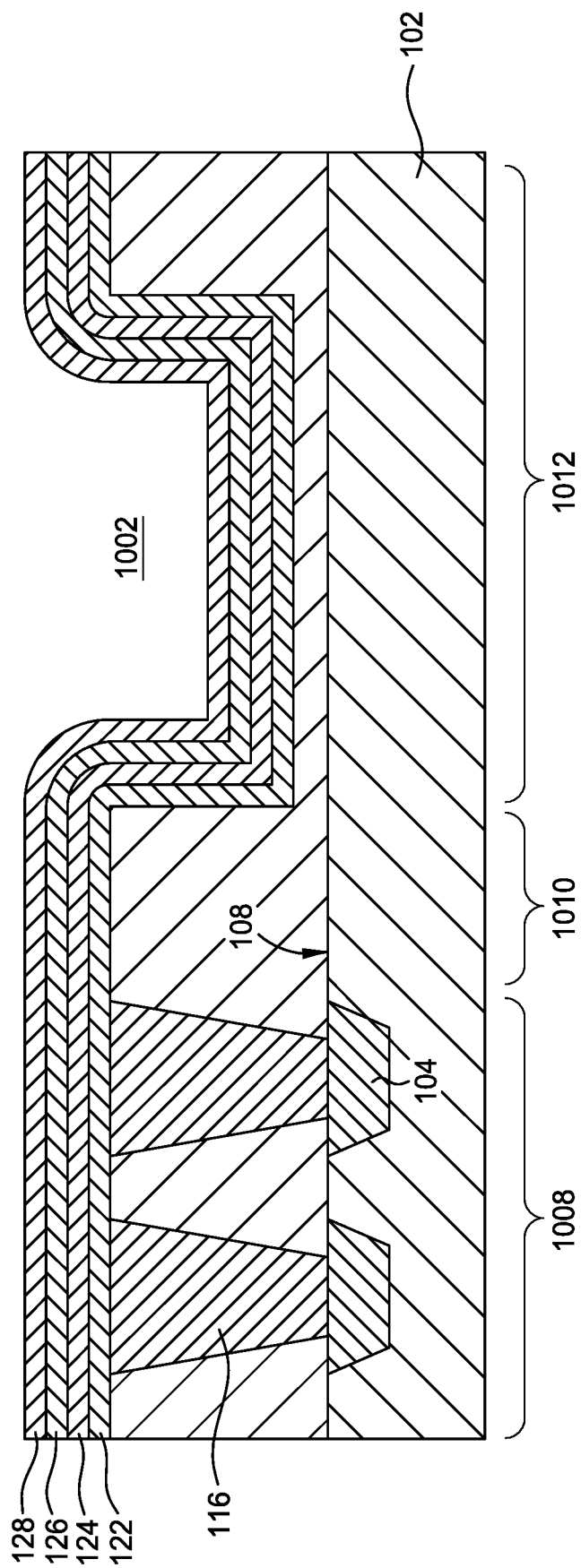
FIG. 11 illustrates a schematic cross-sectional view of the substrate of FIG. 10 with the plurality of layers formed thereon according to an embodiment described herein.

FIG. 11 illustrates a schematic cross-sectional view of the substrate 102 of FIG. 10 with the plurality of layers 122, 124, 126, 128 formed thereon according to an embodiment described herein. The illustrated embodiment is representative of the substrate 102 after processing operations described with regard to FIG. 4. As illustrated, the zero mark 1002 remains visible after deposition of the plurality of layers 122, 124, 126, 128. It is contemplated that the zero mark 1002 is selected with a width and depth to remain visible (i.e. sufficient contrast) to a lithographic scanner even after deposition of the plurality of layers 122, 124, 126, 128. As such, subsequent etching processes may be improved by utilization of the zero mark 1002 for patterning alignment.

By eliminating the utilization of mock openings for conventional patterning processes, the zero mark 1002 enables the utilization of fewer patterning and lithographic processes. Moreover, alignment of devices and structures may be improved due to the improved patterning alignment derived from utilization of the zero mark 1002. For example, the zero mark 1002 is preserved and present for utilization in subsequent processing operations. Conventional alignment techniques are often damages during MTJ or memory stack etching processes due to the complex arrangement of materials in such features. Conventional lithographic alignment marks, such as those fabricated from Cu, W, or TiN, which provide optical contrast from an oxide material are often damaged as described above during various etching processes.

Embodiments of the present disclosure utilize the zero mark 1002 having characteristics selected to increase the resilience and physical presence of the zero mark 1002 throughout an entire process scheme which includes various etching processes. It is believed that the zero mark 1002 described herein will be preserved post MTJ/memory stack, oxide deposition, and lithography stack formation. The zero mark 1002 according to the aforementioned embodiments is robust and provides sufficient differentiation for optical alignment of a lithographic scanner in the patterning of advanced back end of the line MRAM/memory integration processes.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   forming a metallic bottom contact on a substrate;
   depositing a non-metallic interlayer dielectric material on the substrate;
   forming a via within the non-metallic interlayer dielectric material, wherein the via extends from the metallic bottom contact in a first region;
   etching a zero mark in the non-metallic interlayer dielectric material in a second region apart from the first region to a depth less than a total thickness of the non-metallic interlayer dielectric material, wherein the etching a zero mark in the non-metallic interlayer dielectric material is performed prior to deposition of any of a touch layer, a memory stack comprising a plurality of films, wherein at least one film of the plurality of films is a magnesium oxide containing film, or a hardmask;

depositing the touch layer over the non-metallic interlayer dielectric material and the via in the first region and the second region;

depositing the memory stack over the touch layer in the first region and the second region; and depositing the hardmask over the memory stack in the first region and the second region.

2. The method of claim 1, wherein the etching a zero mark comprises masking the first region and etching the non-metallic interlayer dielectric material in the second region.

3. The method of claim 2, wherein the etching the non-metallic interlayer dielectric material in the second region comprises exposing the non-metallic interlayer dielectric material to an anisotropic oxide etching process.

4. The method of claim 1, wherein the zero mark has a width of between about 1 µm and about 2 µm.

5. The method of claim 1, wherein the metallic bottom contact is formed on a metallic portion of the substrate and the via extends from the metallic bottom contact through the non-metallic interlayer dielectric material.

6. The method of claim 1, wherein the touch layer, the memory stack, and the hardmask are conformally deposited over the non-metallic interlayer dielectric material in the first region and the second region.

7. The method of claim 1, wherein the touch layer is selected from the group consisting of a TaN material, a Ta material, and a W material.

8. A substrate processing method, comprising:
forming a bottom contact on a substrate;
depositing a non-metallic interlayer dielectric material on the substrate;
forming a metallic via extending from the bottom contact through the non-metallic interlayer dielectric material in a first region;
etching a zero mark in the non-metallic interlayer dielectric material in a second region apart from the first region to a depth less than a total thickness of the non-metallic interlayer dielectric material, wherein the etching a zero mark in the non-metallic interlayer dielectric material is performed prior to conformal deposition of any of a touch layer, a memory stack comprising a plurality of films, wherein at least one film of the plurality of films is a magnesium oxide containing film, or a hardmask;
conformally depositing the touch layer over the substrate in the first region and the second region;
conformally depositing the memory stack over the touch layer in the first region and the second region;
conformally depositing the hardmask over the memory stack in the first region and the second region;
patterning at least the first region; and
sequentially etching the hardmask, the memory stack, and the touch layer after patterning the first region.

9. The method of claim 8, wherein the etching a zero mark comprises masking the first region and etching the non-metallic interlayer dielectric material in the second region.

10. The method of claim 9, wherein the etching the non-metallic interlayer dielectric material in the second region comprises exposing the substrate to an anisotropic oxide etching process.

11. The method of claim 8, wherein the zero mark has a width of between about 1 µm and about 2 µm.

12. A substrate processing method, comprising:
forming a bottom contact on a substrate;
depositing a non-metallic interlayer dielectric material on the substrate;
etching the non-metallic interlayer dielectric material to expose the bottom contact;
forming a metallic via extending from the bottom contact in a first region;
etching a zero mark in the non-metallic interlayer dielectric material in a second region apart from the first region to a depth less than a total thickness of the non-metallic interlayer dielectric material, wherein the etching a zero mark in the non-metallic interlayer dielectric material is performed prior to conformal deposition of any of a touch layer, a memory stack comprising a plurality of films, wherein at least one film of the plurality of films is a magnesium oxide containing film, or a hardmask;
conformally depositing the touch layer over the non-metallic interlayer dielectric material and the metallic via in the first region and the second region;
conformally depositing the memory stack over the touch layer in the first region and the second region;
conformally depositing the hardmask over the memory stack in the first region and the second region;
patterning at least the first region;
sequentially etching the hardmask, the memory stack, and the touch layer after patterning the first region to expose the non-metallic interlayer dielectric material;
depositing additional interlayer dielectric material and planarizing the additional interlayer dielectric material with the hardmask;
etching at least a portion of the hardmask to form a recess; and
depositing a top contact over the additional interlayer dielectric material and in the recess.

13. The method of claim 12, wherein the etching a zero mark is an anisotropic oxide etch process.

14. The method of claim 12, wherein the zero mark has a width of between about 1 µm and about 2 µm.

15. The method of claim 12, wherein etching the non-metallic interlayer dielectric material to expose a bottom contact further comprises forming a recess, wherein the recess has a width at a top surface of the bottom contact which is less than a width of the top surface of the recess.

16. The method of claim 12, wherein a width of the via structure at a top surface is less than a width of the touch layer at a top surface.

17. The method of claim 16, wherein a difference between the width of the via structure at the top surface and the width of the touch layer at the top surface is less than one third of the width of the touch layer at the top surface.

18. The method of claim 1, further comprising:
patterning at least the first region; and
sequentially etching the hardmask, the memory stack, and the touch layer after patterning the first region.

* * * * *